(12) United States Patent
Wessel et al.

(10) Patent No.: US 9,905,996 B2
(45) Date of Patent: Feb. 27, 2018

(54) HEAT ASSISTED MEDIA RECORDING DEVICE WITH REDUCED LIKELIHOOD OF LASER MODE HOPPING

(71) Applicant: Seagate Technology LLC, Cupertino, CA (US)

(72) Inventors: James Gary Wessel, Savage, MN (US); Karim Tatah, Eden Prairie, MN (US); Mourad Benakli, Eden Prairie, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 298 days.

(21) Appl. No.: 14/492,785

(22) Filed: Sep. 22, 2014

(65) Prior Publication Data

US 2016/0087401 A1 Mar. 24, 2016

(51) Int. Cl.
*H01S 3/04* (2006.01)
*H01S 5/068* (2006.01)
*H01S 5/026* (2006.01)
*G11B 5/02* (2006.01)
*G11B 5/40* (2006.01)
*G11B 19/04* (2006.01)
*H01S 5/024* (2006.01)
*H01S 5/062* (2006.01)
(Continued)

(52) U.S. Cl.
CPC .......... *H01S 5/06804* (2013.01); *G11B 5/02* (2013.01); *G11B 5/40* (2013.01); *G11B 19/046* (2013.01); *H01S 5/0261* (2013.01); *G11B 2005/0021* (2013.01); *H01S 5/02453* (2013.01); *H01S 5/0687* (2013.01); *H01S 5/06216* (2013.01)

(58) Field of Classification Search
CPC .. H01S 5/06804; H01S 5/0612; H01S 5/0261; H01S 5/0651; H01S 5/0687; H01S 5/06216; H01S 5/02453; H01S 5/068; H01S 5/026; H01S 5/065; H01S 5/06; H01L 23/40; H01L 23/24
See application file for complete search history.

(56) References Cited

U.S. PATENT DOCUMENTS 4,817,098 A 3/1989 Horikawa
5,077,751 A * 12/1991 Kudo .................... H01S 3/0941
372/68

(Continued)

FOREIGN PATENT DOCUMENTS

WO WO1999053487 10/1999

OTHER PUBLICATIONS

JP 58-077272 (English Translation) pp. 1-6.*
File History for U.S. Appl. No. 14/492,802.

*Primary Examiner* — Jessica Manno
*Assistant Examiner* — Delma R Forde
(74) *Attorney, Agent, or Firm* — Hollingsworth Davis, LLC

(57) ABSTRACT

An apparatus includes a laser diode, a heater arrangement, and a circuit. The laser diode is configured to facilitate heat assisted magnetic recording during a lasing state. The heater arrangement is positioned proximate the laser diode. The circuit electrically couples the laser diode and the heater arrangement in a parallel relationship. The circuit is configured to alternately operate the laser diode in a lasing state and a non-lasing state, and to activate the heater arrangement during the non-lasing state to warm a junction of the laser diode.

20 Claims, 9 Drawing Sheets

(51) Int. Cl.
*H01S 5/0687* (2006.01)
*G11B 5/00* (2006.01)

(56) References Cited

U.S. PATENT DOCUMENTS

| | | | |
|---|---|---|---|
| 6,039,816 A * | 3/2000 | Morita | B08B 7/0071 134/19 |
| 6,147,795 A * | 11/2000 | Derbyshire | H01S 3/06754 359/337 |
| 6,355,300 B1 | 3/2002 | Stirniman et al. | |
| 6,944,112 B2 | 9/2005 | Challener | |
| 6,975,472 B2 | 12/2005 | Stover et al. | |
| 7,609,480 B2 | 10/2009 | Shukh et al. | |
| 7,995,425 B2 | 8/2011 | Schreck et al. | |
| 8,149,652 B2 | 4/2012 | Erden et al. | |
| 8,254,212 B2 | 8/2012 | Snyder et al. | |
| 8,310,779 B2 | 11/2012 | Hanchi et al. | |
| 8,514,672 B2 | 8/2013 | Grobis et al. | |
| 8,559,127 B2 | 10/2013 | Gage et al. | |
| 8,675,455 B1 * | 3/2014 | Krichevsky | G11B 5/3133 360/59 |
| 9,281,659 B1 * | 3/2016 | Tatah | H01S 5/06804 |
| 2002/0037020 A1 * | 3/2002 | Shimura | H01S 5/0687 372/38.02 |
| 2004/0027728 A1 | 2/2004 | Coffey et al. | |
| 2008/0063016 A1 | 3/2008 | Bhatia et al. | |
| 2008/0218891 A1 | 9/2008 | Gubbins et al. | |
| 2009/0141756 A1 * | 6/2009 | Hiremath | H01S 5/024 372/34 |
| 2012/0201108 A1 | 8/2012 | Zheng et al. | |
| 2013/0010821 A1 * | 1/2013 | Yokoyama | H01S 5/06804 372/28 |
| 2013/0235449 A1 * | 9/2013 | Suzuki | H01S 3/0405 359/341.1 |
| 2014/0029396 A1 | 1/2014 | Rausch et al. | |
| 2014/0029397 A1 | 1/2014 | Rausch et al. | |
| 2015/0078409 A1 * | 3/2015 | Sugihara | G02F 1/37 372/22 |
| 2015/0262596 A1 * | 9/2015 | Zuckerman | G11B 5/4866 369/13.13 |
| 2015/0340053 A1 * | 11/2015 | Peng | G11B 5/314 369/13.33 |

* cited by examiner

HEAT ASSISTED MEDIA RECORDING DEVICE WITH REDUCED LIKELIHOOD OF LASER MODE HOPPING

SUMMARY

Examples described herein include methods, apparatuses, and techniques related to heat-assisted media recording (HAMR). In one embodiment, an apparatus includes a laser diode, a heater arrangement, and a circuit. The laser diode is configured to facilitate heat assisted magnetic recording during a lasing state. The heater arrangement is positioned proximate the laser diode. The circuit electrically couples the laser diode and the heater arrangement in a parallel relationship. The circuit is configured to alternately operate the laser diode in a lasing state and a non-lasing state, and to activate the heater arrangement during the non-lasing state to warm a junction of the laser diode.

According to another embodiment, an apparatus includes measuring a junction temperature of a laser diode in a lasing state that facilitates heat assisted recording and in the non-lasing state, generating a drive signal having an energizing portion and a non-energizing portion to cause the laser diode to operate in the lasing state and non-lasing state, respectively, activating a diode of a heater arrangement coupled in parallel with the laser diode using at least the non-energizing portion of the drive signal, and heating the laser diode using the heater arrangement during at least the non-lasing state.

Another exemplary embodiment is directed to an apparatus that includes a laser diode, a heater arrangement, and a circuit. The laser diode is configured to facilitate heat assisted magnetic recording during a lasing state. The heater arrangement is positioned proximate the laser diode. The circuit electrically couples the laser diode and the heater arrangement in a parallel relationship. The circuit is configured to alternately operate the laser diode in a lasing state and a non-lasing state, and to activate the heater arrangement during at least a portion of the non-lasing state and at least a portion of the lasing state to warm a junction of the laser diode.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
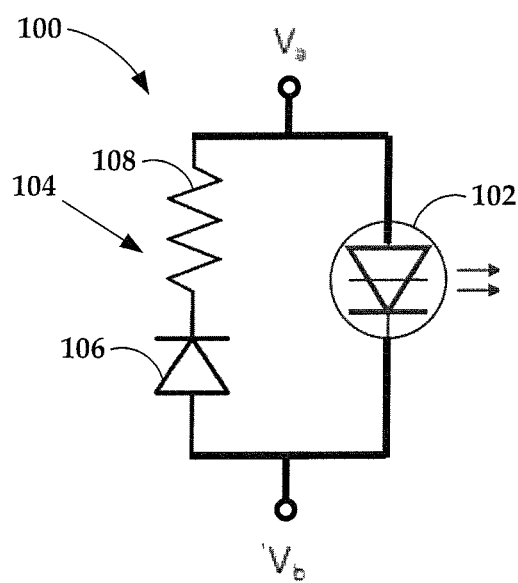
FIG. 1 is a schematic that includes a laser diode coupled in parallel with a heater arrangement according to an example embodiment.

This disclosure describes structures and techniques for mitigating temperature-induced mode hopping of a laser diode used in heat-assisted magnetic recording (HAMR) devices. In particular, some embodiments determine a junction temperature of the laser diode and can have a heating element that warms the junction to mitigate instances of power instability associated with laser diode mode hopping during HAMR. Other embodiments determine the junction temperature of the laser diode and predict a likelihood that mode hopping will occur. One or more measures can be implemented based upon the prediction that mode hopping is likely to reduce its negative impact upon HAMR.

In HAMR devices, also sometimes referred to as thermal-assisted magnetic recording (TAMR) devices or energy assisted magnetic recording (EAMR), a magnetic recording medium (e.g., hard drive disk) is able to overcome superparamagnetic effects that limit the areal data density of typical magnetic media. In a HAMR recording device, information bits are recorded on a storage layer at elevated temperatures. The heated area in the storage layer determines the data bit dimension, and linear recording density is determined by the magnetic transitions between the data bits.

In order to achieve desired data density, a HAMR recording head (e.g., slider) includes optical components that direct light from a laser diode to the recording media. The HAMR media hotspot may need to be smaller than a half-wavelength of light available from current sources (e.g., laser diodes). Due to what is known as the diffraction limit, optical components cannot focus the light at this scale. One way to achieve tiny confined hot spots is to use an optical near field transducer (NFT), such as a plasmonic optical antenna. The NFT is designed to support local surface-plasmon at a designed light wavelength. At resonance, high electric field surrounds the NFT due to the collective oscillation of electrons in the metal. Part of the field will tunnel into a storage medium and get absorbed, raising the temperature of the medium locally for recording. During recording, a write element (e.g., write pole) applies a magnetic field to the heated portion of the medium. The heat lowers the magnetic coercivity of the media, allowing the applied field to change the magnetic orientation of heated portion. The magnetic orientation of the heated portion determines whether a one or a zero is recorded. By varying the magnetic field applied to the magnetic recording medium while it is moving, data is encoded onto the medium.

A HAMR drive uses a laser diode to heat the media to aid in the recording process. Due to inefficiencies of electric to optical power, the laser diode also heats itself during lasing. Components (writer, reader, heat elements) in the magnetic slider also dissipate heat and the heat is conducted to laser diode as the laser diode submount is mounted on the slider. These components (including the laser diode) can experience significant heating due to light absorption and electric-to-optical conversion inefficiencies as energy produced by the laser diode is delivered to the magnetic recording medium (not shown). During write operation, these light absorption and inefficiencies will vary the junction temperature of the laser diode, causing a shift in laser emission wavelength, leading to a change of optical feedback from optical path in slider to the cavity of the laser diode, a phenomenon that is known to lead to mode hopping/power instability of the laser diode. Mode hopping is particularly problematic in the context of single-frequency lasers. Under some external influences, a single-frequency laser may operate on one resonator mode (e.g., produce energy with a first wavelength) for some time, but then suddenly switch to another mode (produce energy, often with different magnitude, with a second wavelength) performing "mode hopping." Temperature variation is known to cause mode hopping in laser diodes. Some of the physical mechanisms for thermally-induced mode hopping are thought to be temperature dependence of laser gain, index of refraction, and cavity length.

Mode hopping is problematic for HAMR applications, as mode hopping leads to laser output power jumping and magnetic transition shifting from one block of data to another. Large transition shifts in a block of data cannot be recovered in channel decoding, resulting in error bits. This disclosure discusses various techniques, methods, and apparatuses that can be used to predict a likelihood of mode hopping occurring during HAMR. Additionally, various techniques, methods, and apparatuses are disclosed that can be used to mitigate the occurrence of mode hopping and/or reduce the undesirable effects of mode hopping for HAMR applications.

FIG. 1 is a simplified circuit arrangement 100 that electrically couples a laser diode 102 and a heater arrangement 104 in a parallel relationship. The heater arrangement 104 can be disposed proximate the laser diode 102 (e.g., in, along, or adjacent thereto) and can be used to heat the laser diode 102. Indeed in some instances the spatial proximity of the heater arrangement 104 to the junction of the laser diode 102 is such that heat can diffuse quickly (e.g., <1 μs) to the laser junction and maintain a smaller laser junction temperature variation. Thus, in some configurations, the heater arrangement 104 can be positioned in or along the laser diode 102 itself. In other configurations, the heater arrangement 104 can be disposed on adjacent components such as the transducer head, etc. In the embodiment shown in FIG. 1, the heater arrangement can comprise a diode 106 coupled in series with a heater/thermistor 108. However, in some embodiments the heater arrangement can be comprised of only a diode (e.g. FIG. 3). The heater/thermistor 108 can allow the heater arrangement 104 to act as a temperature sensor of the junction temperature of the laser diode 102 (at least during a portion of the non-lasing state) in addition to providing heating to the junction. In some cases, the temperature sensor can be configured to measure a temperature of the junction of the laser diode in one or both of the lasing state and the non-lasing state.

As illustrated in FIG. 1, the circuit 100 is configured to alternately operate the laser diode 102 in a lasing state and a non-lasing state, and to activate the heater arrangement 104 during the non-lasing state to warm a junction of the laser diode 102. In the embodiment of FIG. 1, the heater arrangement 104 includes the diode 106, which is configured/arranged to be reverse biased during the lasing state and forward biased during the non-lasing state for the laser diode 102. Thus, the heater arrangement 104 and circuit 100 are configured to provide heating to the laser diode 102 during the non-lasing state and the heater arrangement 104 is configured to warm the laser diode junction to a temperature associated with a reduced risk of mode hopping of the laser diode 102. The heater arrangement 104 can be controlled (e.g., through a pre-amp current driver) to maintain the temperature at the junction within a predetermined temperature range.

Using the circuit 100 and components (e.g., diode 106 and heater/thermistor 108) of FIG. 1, the junction temperature can be measured during the non-lasing state. The junction temperature during the lasing state can be measured by another sensor (e.g. thermistor, photodiode, etc.), the heater/thermistor 108, and/or the diode 106 in some instances. Thus, the diode 106 can function as a temperature sensor in some embodiments. Junction temperature can be measured when the laser diode 102 is in the lasing state and the non-lasing state. Based upon the measured junction temperatures during the lasing state and the non-lasing state, a drive signal can be applied to the heater arrangement 104 to provide heating to the laser diode 102 during at least the non-lasing state as the diode 106 is configured to be reverse biased during the lasing state and forward biased during the non-lasing state.

Figure 2:
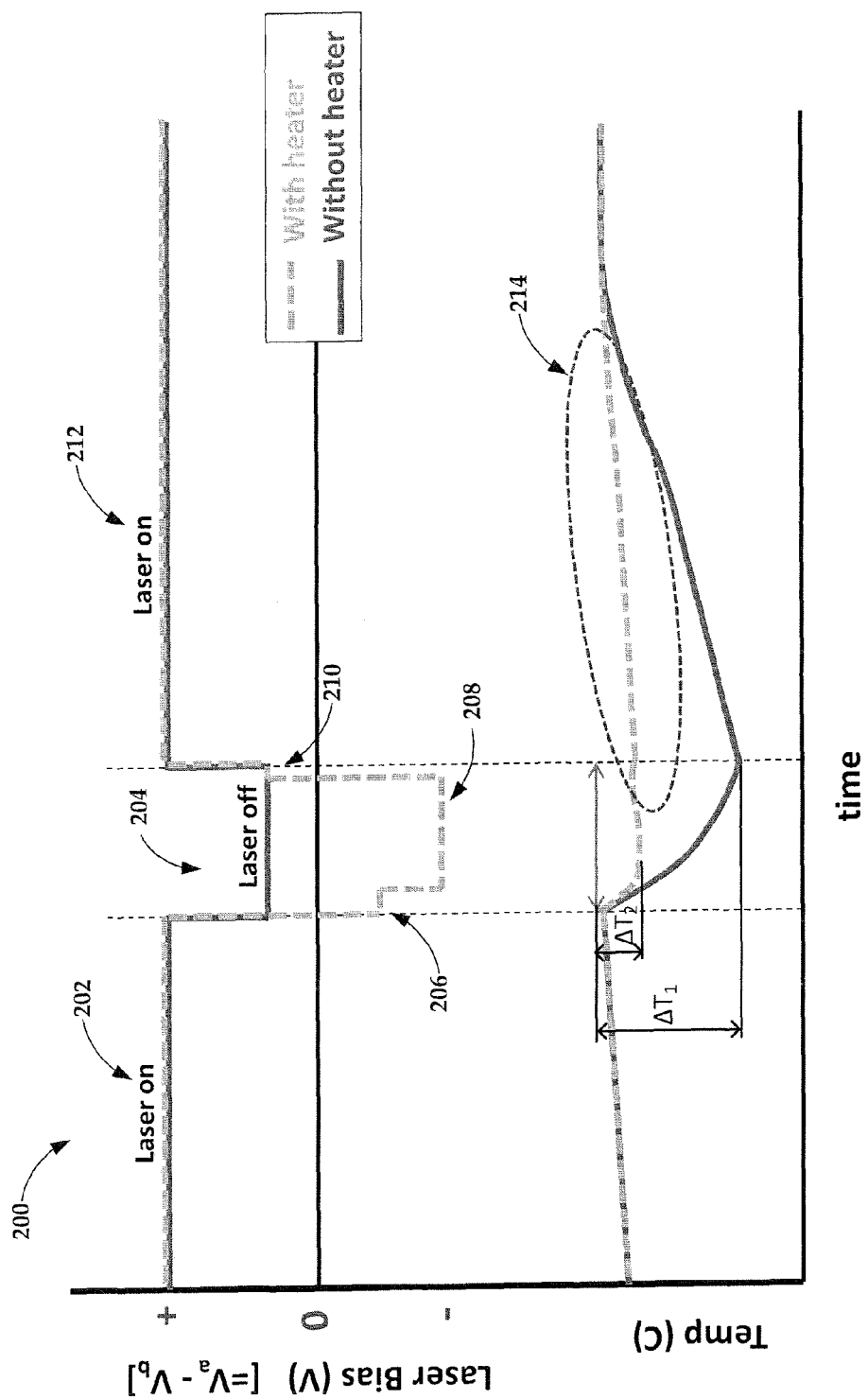
FIG. 2 is a graph of laser bias and temperature over time with and without heating applied thereto according to an example embodiment.

FIG. 2 is a graph 200 of laser bias, $V=[V_a-V_b]$, and laser junction temperature for the circuit 100 and components (e.g., laser diode 102) of FIG. 1 (indicated in FIG. 2 as "with heater") as compared to a circuit and a laser diode that are not part of such an arrangement (indicated in FIG. 2 as "without heater"). As illustrated in FIG. 2, both arrangements (circuit with heater, and circuit without heater) operate with the same laser bias voltage and junction temperature during a first laser on period 202. However, during a laser off period 204, the heater arrangement 104 (diode 106) is forward biased (e.g., provided with negative bias from the laser perspective). During the initial time period of the laser off period 204, the heater arrangement 104, with the heater/thermistor 108, acts in a thermistor mode 206 to measure the laser temperature at the junction (in addition to providing heating thereto). Thus, the heater/thermistor 108 serves as a temperature sensor for the laser diode junction at least during a portion of the non-lasing state. In some cases, sensing can be accomplished during a lower laser bias level than during heater mode 208, as illustrated in FIG. 2. One or both of the thermistor mode 206 and the heater mode 208 may involve application of preheating to the junction during the laser off period 204. When lasing is desired, the laser bias is driven in an opposing direction such that the laser diode 102 is ready for lasing as illustrated by 210. Application of a higher forward bias voltage to the laser diode causes the laser to laser in a laser on mode 212.

FIG. 2 additionally illustrates the difference between junction temperatures of a laser diode without heating and the laser diode 102 with heating. As illustrated in FIG. 2, region 214 of the laser diode 102 experiences a much smaller temperature fluctuation at the junction than the laser diode with no heater. Thus, $\Delta T_2 < \Delta T_1$ (i.e. the temperature differential $\Delta T_2$ of the junction for the laser diode 102 between the lasing state and the non-lasing state is smaller than the temperature differential $\Delta T_1$ of the junction for the laser diode without a heater between the lasing state and the non-lasing state).

Figure 3:
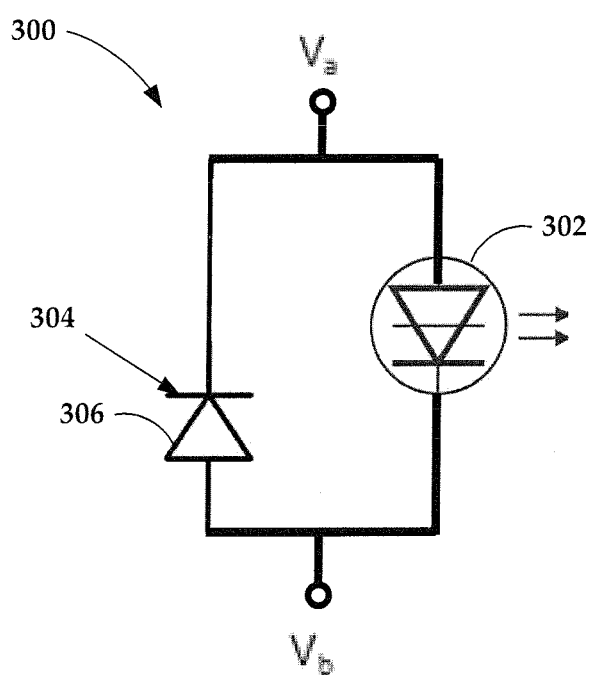
FIG. 3 is a schematic that includes a laser diode coupled in parallel with a heater arrangement according to another example embodiment.

FIG. 3 is a simplified circuit arrangement 300 that electrically couples a laser diode 302 and a heater arrangement 304 in a parallel relationship. FIG. 3 illustrates an embodiment in which current passing through the forward biased diode 306 provides sufficient heat generation for the laser diode 302 during the non-lasing state, without need for an additional heating element (e.g., resistor or thermistor). The circuit arrangement 300 and components are configured in the manner previously discussed with regard to FIG. 1. The heater arrangement 304 of FIG. 3 comprises a diode 306, which is configured to be reverse biased during the lasing state and forward biased during the non-lasing state for the laser diode 302. The diode 306 can also act as a temperature sensor in some embodiments. Thus, the heating arrangement 304 can also be a temperature sensor. The circuit 300 is configured to alternately operate the laser diode 302 in a lasing state and a non-lasing state, and to activate the heater arrangement 304 (e.g. the diode 306) during the non-lasing state to warm a junction of the laser diode 302.

Figure 4:
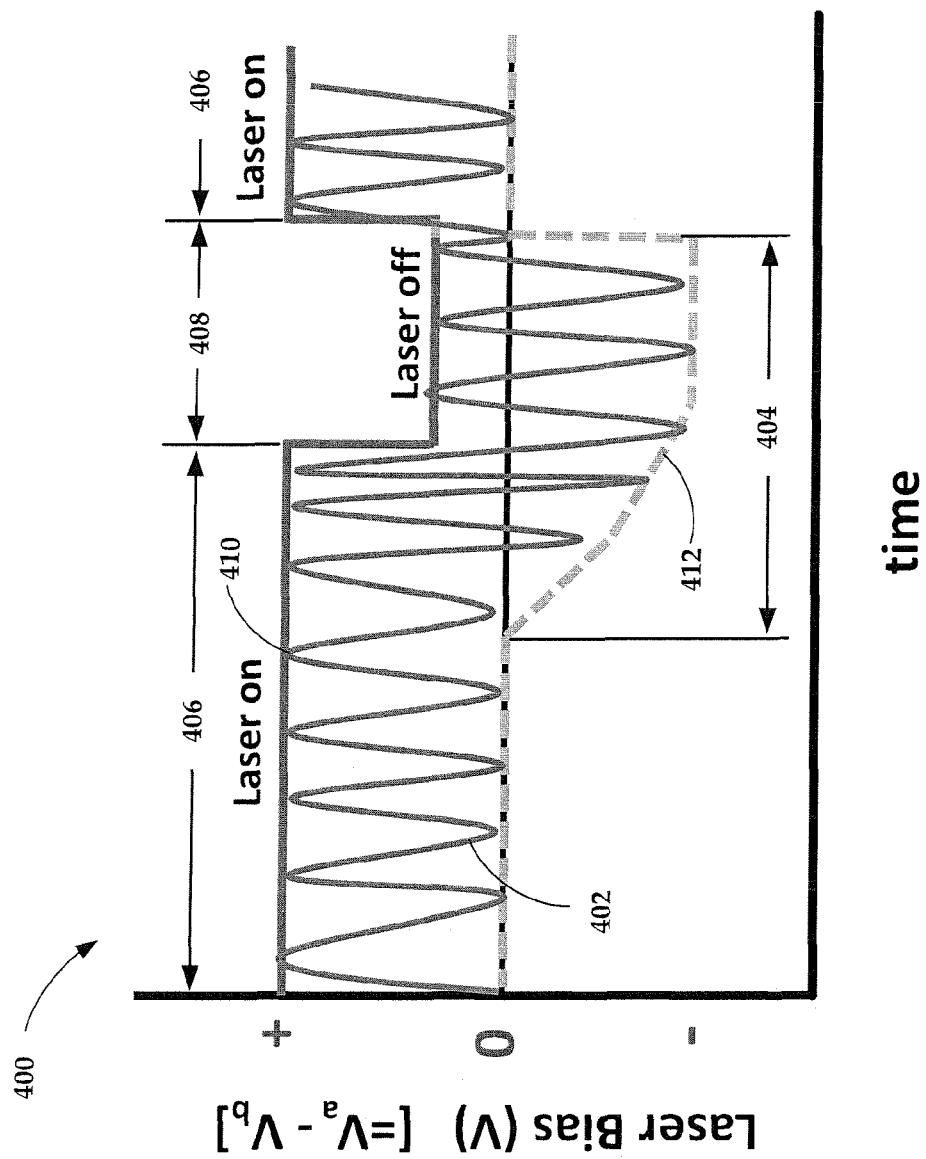
FIG. 4 is a graph of laser bias over time and illustrating an oscillating drive signal including a negative-going portion for forward biasing a heating arrangement according to an example embodiment.

In addition to providing heating to the laser diode junction during the non-lasing state in some embodiments, the embodiments of FIGS. 1 and 3 can also in some scenarios be used to activate the heater arrangement 104, 304 during at least a portion of the non-lasing state and at least a portion of the lasing state to warm the junction of the laser diode 102, 302. FIG. 4 provides a graph 400 of such a scenario. FIG. 4 shows laser bias over time and illustrates an oscillating drive signal 402 including a negative-going portion 404 for forward biasing the heater arrangement 104, 304 to produce heat. In FIG. 4, the generated drive signal 402 has an energizing portion 406 and a non-energizing portion 408 that causes the laser diode 102, 302 to operate in the lasing state and non-lasing state, respectively. As illustrated in FIG. 4, the energizing portion 406 comprises part of the negative-going portion 404 for forward biasing the heater arrangement 104, 304 (e.g. diode 106, 306) during at least a portion of the lasing state. The drive signal 402 can be viewed as having a first envelop 410 defined by the positive amplitude peaks of the drive signal 402. The drive signal 402 can be viewed as having a second envelop 412 defined by the negative amplitude peaks of the drive signal 402. The magnitude of the bias voltage defining the first envelop 410 dictates whether the laser diode is in the lasing or non-lasing state (laser on, laser off). The magnitude of the bias voltage defining the second envelop 412 dictates if and to what extent the heater arrangement 104, 304 (e.g., diode 106, 306) is producing heat. The drive signal 402 can be generated with a frequency and amplitude profile sufficient to produce both lasing and heating as desired. For example, one or both of the bias voltage magnitude and frequency can be selected and adjusted to shape the negative-going heating envelop of the drive signal to achieve a desired level of laser diode heating during at least a portion of the lasing state and the non-lasing state. Analysis indicates that HAMR recording can be successful if the frequency of laser diode bias is higher than approximately half the drive data-rate. As a numerical example, consider a disc drive with data-rates on the order of 4 gigabits per second. In this case, the minimum frequency for laser diode bias is expected to be on the order of 2 GHz.

Figure 5:
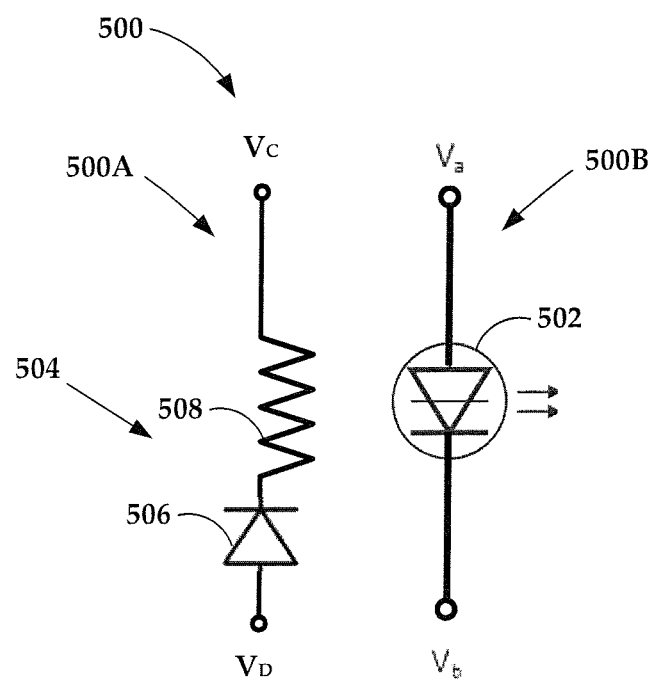
FIG. 5 is a schematic view of a laser diode and a heater arrangement each part of an independent circuit according to yet another example embodiment.

FIG. 5 is another simplified view of two circuits 500 that are electrically separated from one another yet allow for heat generated by components electrically coupled to a first circuit 500A to heat components that are electrically coupled to a second circuit 500B. The second circuit 500B allows a bias voltage ($V_a$–$V_b$) to be applied to a laser diode 502. The first circuit 500A allows a second bias voltage ($V_d$–$V_c$) to be applied to a heater arrangement 504. The heater arrangement 504 can be disposed proximate the laser diode 502 as described previously and can be used to heat the laser diode 502. Indeed, in some instances the spatial proximity of the heater arrangement 504 to the laser junction is such that heat can diffuse quickly (e.g., <1 µs) to the laser junction and maintain a small laser junction temperature variation. In the embodiment of FIG. 5, the heater arrangement 504 can comprise a diode 506 coupled in series with a heater 508. However, in some embodiments the heater arrangement 504 can comprise only a diode, or can comprise a heater/thermistor as previously discussed. In some instances, the diode 506 can comprise a photodiode arranged to facilitate power monitoring of the laser diode 502. The photodiode could provide heating of the laser diode during at least the non-lasing state. The heater arrangement 504 and the first circuit 500A are configured to provide heating to the laser diode 502 as desired (e.g., during one or both of the non-lasing state and the lasing state). For example, the first circuit 500A can be activated during the non-lasing state to heat the laser diode 502, and during at least an end portion of the lasing state to pre-heat the laser diode 502 and thereby reduce the junction temperature variation between lasing and non-lasing states. The heater arrangement 504 can be configured to warm the laser diode junction to a temperature associated with a reduced risk of mode hopping of the laser diode 502. Additionally, the heater arrangement 504 can be controlled (e.g., through a pre-amp current driver) to maintain the temperature at the junction within a predetermined temperature range.

Figure 6:
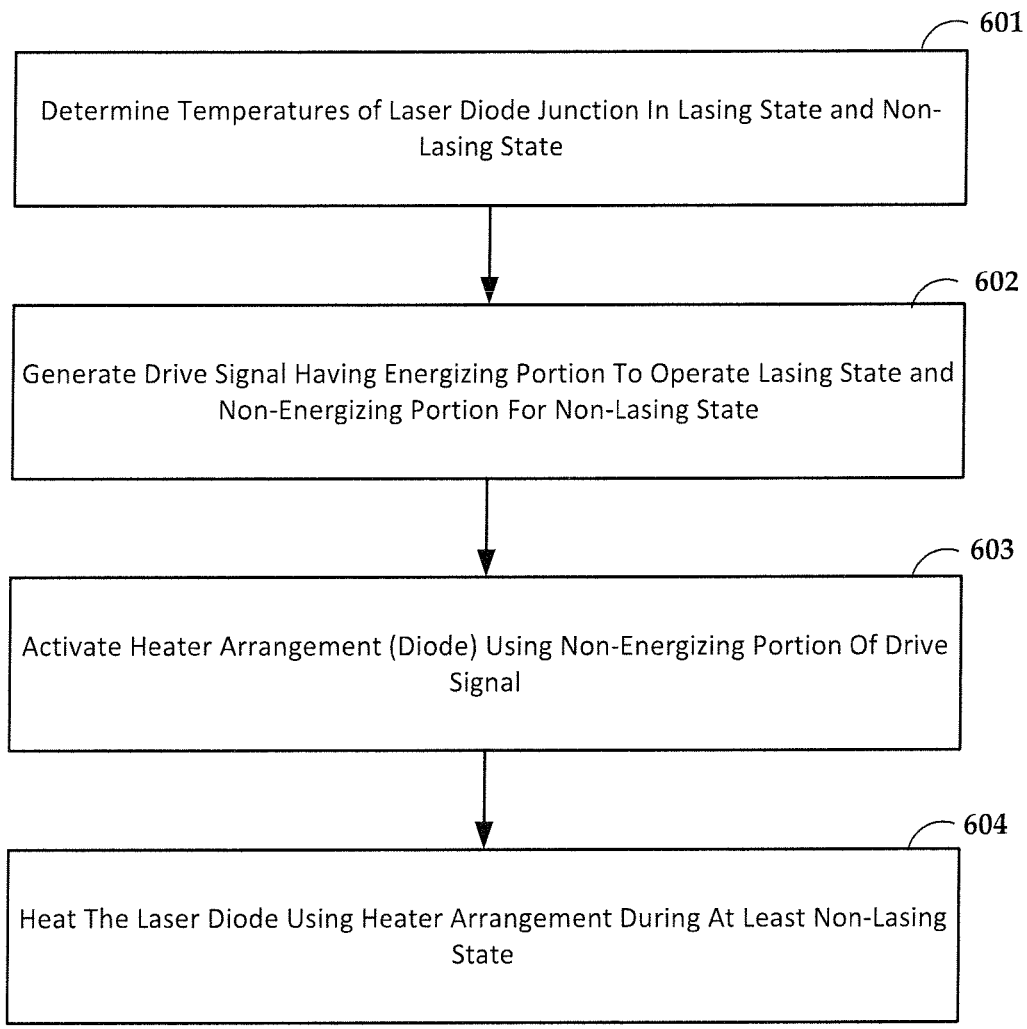
FIG. 6 is a flow chart of a process/method according to an example embodiment.

FIG. 6 illustrates an exemplary method that utilizes a circuit (e.g. 100, 300, 500, etc.) to measure a junction temperature of and heat a laser diode. The method measures 601 the junction temperature of a laser diode in a lasing state that facilitates heat assisted recording and in the non-lasing state. The method generates 602 a drive signal having an energizing portion and a non-energizing portion to cause the laser diode to operate in the lasing state and non-lasing state, respectively. The method activates 603 a diode of a heater arrangement coupled in parallel with the laser diode using at least the non-energizing portion of the drive signal, and heats 604 the laser diode using the heater arrangement during at least the non-lasing state. In some cases, the energizing portion can comprise a negative-going portion for forward biasing the diode during at least a portion of the lasing state and the heating of the laser diode can occur during at least a portion of the lasing state. In some instances, the heater arrangement can facilitate measurement of the junction temperature (i.e. act as a temperature sensor). The operation of the heater arrangement can be controlled based upon the measured junction temperature. Heating can occur such that the junction temperature falls within a temperature range associated with a reduced risk of mode hopping of the laser diode.

Figure 7:
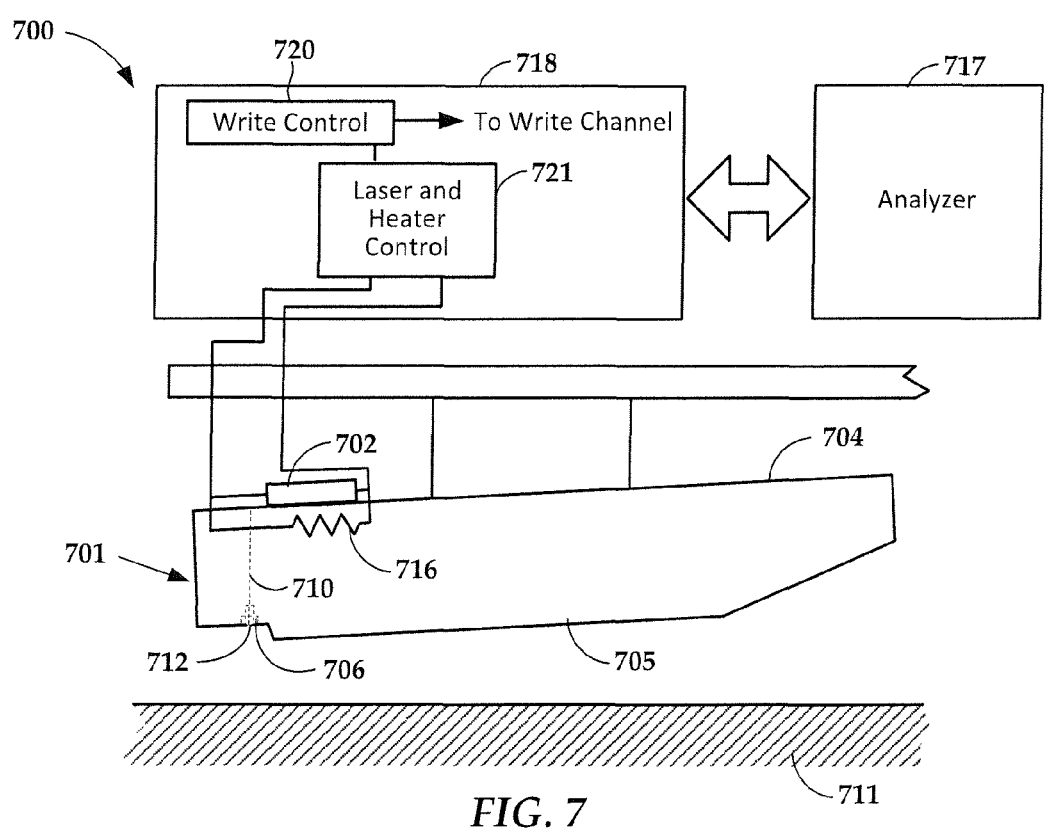
FIG. 7 is a schematic view of an apparatus and related components according to an example embodiment.
Figure 8:
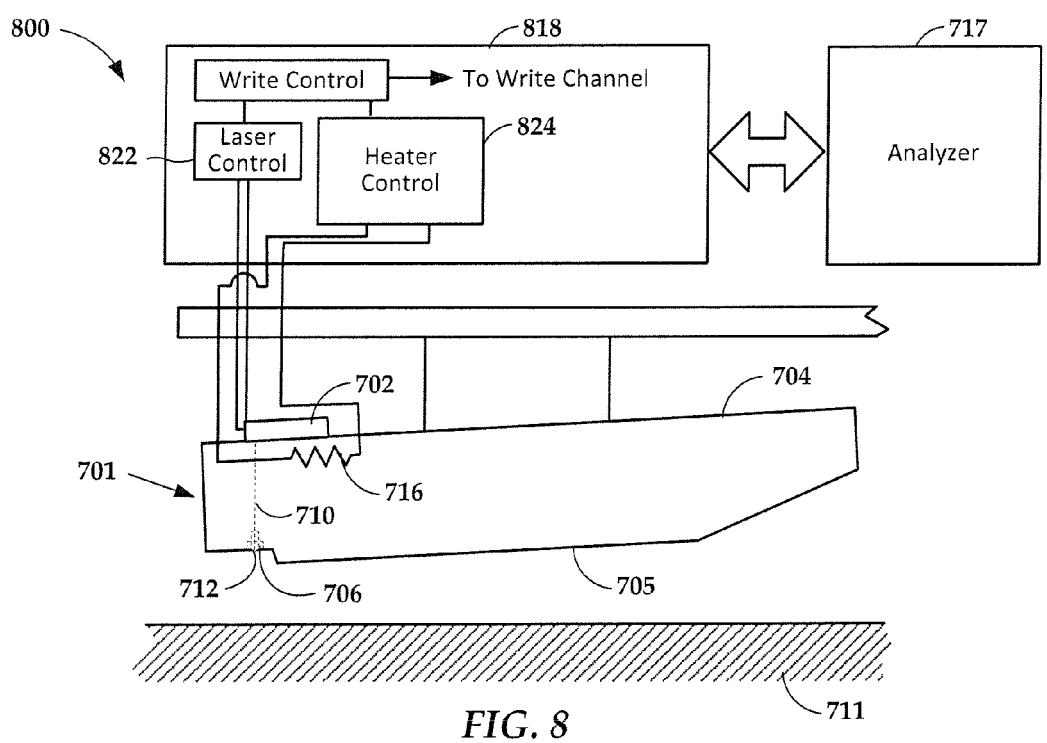
FIG. 8 is a schematic view of an apparatus and related components according to another example embodiment.
Figure 9:
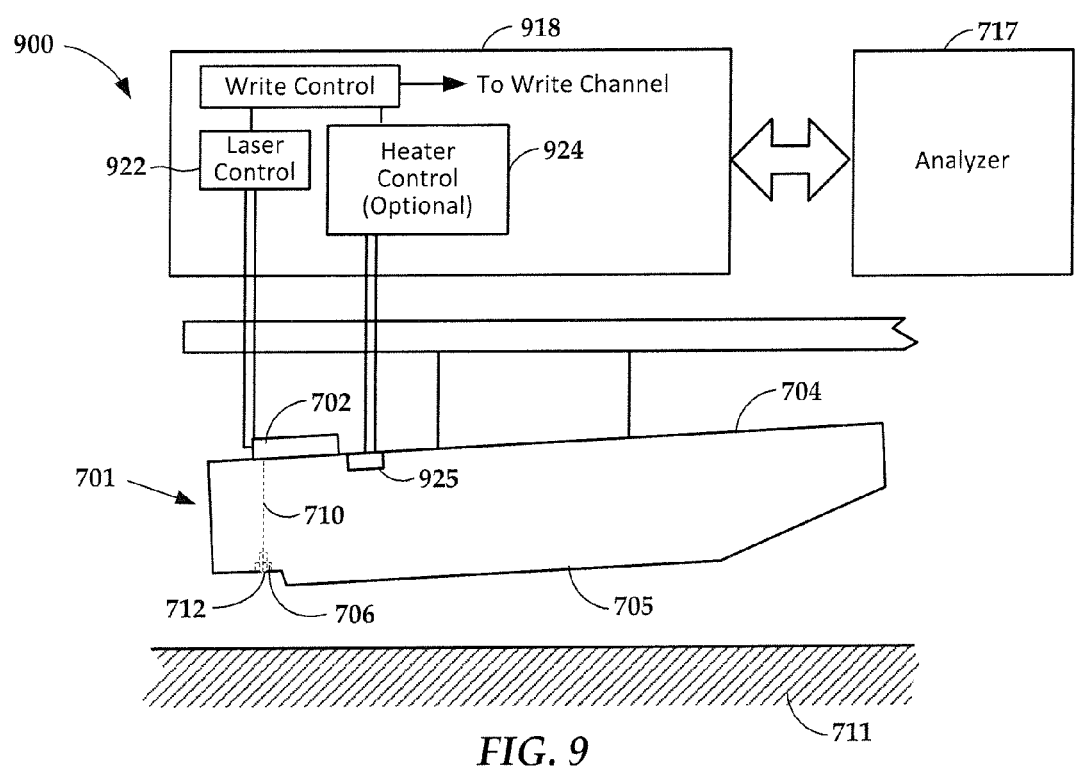
FIG. 9 is a schematic view of an apparatus and related components according to yet another example embodiment.

FIGS. 7-9 are schematic views of apparatuses 700, 800, and 900 (e.g., HAMR apparatuses) and related components that can utilize heating of a junction of a laser diode to reduce laser mode hopping according to various embodiments. FIGS. 7-9 show views of a HAMR configuration according to one example embodiment. In FIGS. 7-9, the configuration is a laser-on-slider (LOS) configuration. Other configurations, such as a laser-in-slider (LIS) configuration, are contemplated. Indeed, the embodiments described may be applicable to a variety of energy delivery configurations and laser diode types. In the LOS configuration, each apparatus (slider) 700, 800, and 900 includes a slider body 701 having a laser diode 702 mounted to or otherwise disposed adjacent (e.g., with use of a submount) a first surface 704 thereof. The laser diode 702 is proximate to a HAMR read/write element 706, which has one edge on an air bearing surface 705 of the slider body 701. The air bearing surface 705 faces and is held proximate to a moving magnetic recording medium 711 during device operation.

While here the read/write element 706 is shown as a single unit, this type of device may have a physically and electrically separate read element (e.g., magnetoresistive stack) and write element (e.g., a write coil and pole) that are located in the same general region of the slider body 701. The separate read and write portion of the read/write element 706 may be separately controlled (e.g., having different signal lines, different head-to-media spacing control elements, etc.), although may share some common elements (e.g., common signal return path). It will be understood that the concepts described herein relative to the read/write element 706 may be applicable to individual read or write portions thereof, and may be also applicable where multiple ones of the read write portions are used, e.g., two or more read elements, two or more write elements, etc.

The laser diode 702 provides electromagnetic energy to heat the media surface at a point near to the read/write element 706. Optical path components, such as a waveguide 710, can be formed integrally within the slider body 701 to deliver light from the laser diode 702 to the medium 711. In particular, a local waveguide and NFT 712 may be located proximate the read/write element 706 to provide local heating of the media during write operations. The NFT is designed to support local surface-plasmon at a designed light wavelength. At resonance, high electric field surrounds the NFT due to the collective oscillation of electrons in the metal. Part of the field will tunnel into a storage medium and get absorbed, raising the temperature of the medium locally for recording.

In FIG. 7, the apparatus 700 can include one or more heater arrangements 716 configured to warm a junction of the laser diode. The heater arrangement 716 may be positioned proximate (e.g., adjacent) the laser diode 702 as illustrated or in other embodiments may be disposed within or along the laser diode itself. In FIG. 7, an analyzer 717 (e.g., a processor) is illustrated communicating with a controller 718. The analyzer 717 can be configured to determine a temperature of the laser diode junction in some instances. Additionally, the analyzer 717 can determine laser diode power output (e.g., from a photodiode), and compare junction temperature and an injection current supplied during the lasing state to stored combinations of junction temperature and injection current to determine a likelihood of mode hopping occurring for the laser diode during the lasing state. The controller 718 can communicate with the analyzer and can be configured to vary the current supplied to the heater arrangement for varying a temperature of the junction to reduce the likelihood of mode hopping occurring during the lasing state.

FIG. 7 shows an arrangement where the laser diode 702 and heater arrangement 716 are controlled together. Thus, the controller 718 can be coupled to both the heater arrangement 716 and the laser diode 702 to control lasing and to control when the heater arrangement 716 is on relative to the non-lasing state (and/or the lasing state). Optionally, or in addition, the controller 718 can be used to control an amount of injection current (power) applied to one or both of the heater arrangement 716 and the laser diode 702 to vary a temperature of the junction.

The controller 718 can include a write control module 720 that controls various aspects of the device during write operations. For a HAMR device, writing involves activating the laser diode 702 while writing to the media, which is indicated by way of laser and heater control module 721. The laser and heater control module 721 includes circuitry that switches the laser diode 702 on and off, e.g., in response to a command from write control module 720. In some embodiments, the laser and heater control 721 can switch the heater arrangement 716 on and off inversely to the laser diode 702 to warm the junction of the laser diode 702 as discussed with reference to FIGS. 1, 3, and 5. In other embodiments, the laser and heater control 721 can activate the heating arrangement during at least a portion of the non-lasing state and at least a portion of the lasing state to warm the junction of the laser diode as discussed with reference to FIGS. 1, 3, and 5.

FIG. 8 illustrates an embodiment with a controller 818 coupled to both the heater arrangement 716 and the laser diode 702 to control lasing and to control when the heater arrangement 716 is on relative to the non-lasing state (and/or the lasing state). The controller 818 can be coupled to the analyzer 717, which provides for monitoring as discussed previously. The embodiment of FIG. 8 has a separate laser control 822 in addition to a heater control 824. The laser control 822 and the heater control 824 can be used to activate the heater arrangement 716 during (a) the non-lasing state or (b) at least a portion of the non-lasing state and at least a portion of the lasing state to warm the junction of the laser diode 702.

FIG. 9 illustrates yet another embodiment with a controller 918 coupled to both the heater arrangement 716 and the laser diode 702 to control lasing and to control when the heater arrangement 716 is on relative to the non-lasing state (and/or the lasing state). The controller 918 can be coupled to the analyzer 717, which provides for monitoring as discussed previously. FIG. 9 has a laser control 922 and a heater control 924. Although illustrated as two separate modules in FIG. 9, in some embodiments the laser control 922 and the heater control 924 can be combined. The heater control 924 can be coupled to a laser power monitor 925 (e.g., a photodiode) disposed proximate the laser diode 702 to allow for monitoring of the junction. In some instances, the laser power monitor 925 can optionally be disposed sufficiently close to the laser diode 702 and be configured to warm the junction, and thereby reduce the likelihood of mode hopping. Thus, the laser control 922 and the heater control 924 can used to activate the laser power monitor 925 to provide heating during (a) the non-lasing state or (b) at least a portion of the non-lasing state and at least a portion of the lasing state to warm the junction of the laser diode 702.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:
1. An apparatus, comprising:
 a laser diode configured to facilitate heat assisted magnetic recording during a lasing state;
 a heater arrangement proximate the laser diode; and
 a circuit electrically coupling the laser diode and the heater arrangement in a parallel relationship and to a controller configured to control the parallel-coupled laser diode and heater arrangement, the circuit configured to alternately operate the laser diode in the lasing state and a non-lasing state, and to activate the heater arrangement during the non-lasing state to warm a junction of the laser diode.

2. The apparatus of claim 1, wherein the heater arrangement comprises a temperature sensor configured to measure a temperature of the junction of the laser diode in one or both of the lasing state and the non-lasing state.

3. The apparatus of claim 2, further comprising:
an analyzer configured to determine a temperature at a junction of a laser diode when the laser diode is operated in the lasing state, wherein the analyzer compares the junction temperature and an injection current supplied during the lasing state to stored combinations of junction temperature and injection current to determine a likelihood of mode hopping occurring for the laser diode during the lasing state; and
a controller in communication with the analyzer and configured to vary a current supplied to the heater arrangement for varying a temperature of the junction to reduce the likelihood of mode hopping occurring during the lasing state.

4. The apparatus of claim 1, wherein the heater arrangement comprises a diode arranged to be reverse biased during the lasing state and forward biased during the non-lasing state, the forward biased diode generating heat to warm the junction of the laser diode.

5. The apparatus of claim 1, wherein the heater arrangement comprises a photodiode arranged to facilitate power monitoring of the laser diode and heating of the laser diode during at least the non-lasing state.

6. The apparatus of claim 1, wherein the heater arrangement comprises a diode coupled in series with a heater, the diode arranged to be reverse biased during the lasing state and forward biased during the non-lasing state.

7. The apparatus of claim 1, wherein:
the heater arrangement comprises a diode coupled in series to a thermistor;
the diode is arranged to be reversed bias during the lasing state and forward biased during the non-lasing state; and
the thermistor serves as a temperature sensor for the junction at least during a portion of the non-lasing state.

8. The apparatus of claim 1, wherein the controller is configured to vary a current supplied to the heater arrangement for varying a temperature of the junction.

9. The apparatus of claim 1, wherein the heater arrangement is configured to warm the junction to a temperature associated with a reduced risk of mode hopping of the laser diode.

10. A method, comprising:
measuring a junction temperature of a laser diode in a lasing state that facilitates heat assisted recording and in a non-lasing state;
generating a drive signal having an energizing portion and a non-energizing portion to cause the laser diode to operate in the lasing state and non-lasing state, respectively;
activating a diode of a heater arrangement coupled in parallel with the laser diode and to a controller configured to control the parallel-coupled laser diode and heater arrangement using at least the non-energizing portion of the drive signal; and
heating the laser diode using the heater arrangement during at least the non-lasing state.

11. The method of claim 10, wherein:
the energizing portion comprises a negative-going portion for forward biasing the diode during at least a portion of the lasing state; and
heating the laser diode comprises heating the laser diode using the heater arrangement during at least a portion of the lasing state.

12. The method of claim 10, wherein measuring the junction temperature of the laser diode during the non-lasing state is facilitated by the heater arrangement.

13. The method of claim 10, comprising controlling operation of the heater arrangement based on the measured junction temperature.

14. The method of claim 10, comprising forward biasing the diode during at least a portion of the lasing state and the non-lasing state.

15. The method of claim 10, wherein heating the laser diode comprises heating the laser diode to a temperature that falls within a temperature range associated with a reduced risk of mode hopping of the laser diode.

16. An apparatus, comprising:
a laser diode configured to facilitate heat assisted magnetic recording during a lasing state;
a heater arrangement proximate the laser diode; and
a circuit electrically coupling the laser diode and the heater arrangement in a parallel relationship and to a controller configured to control the parallel-coupled laser diode and heater arrangement, the circuit configured to alternately operate the laser diode in the lasing state and a non-lasing state, and to activate the heater arrangement during at least a portion of the non-lasing state and at least a portion of the lasing state to warm a junction of the laser diode.

17. The apparatus of claim 16, wherein:
the circuit is configured to receive a drive signal having an energizing portion and a non-energizing portion to cause the laser diode to operate in the lasing state and non-lasing state, respectively, the energizing portion having a positive-going portion and a negative-going portion; and
the heater arrangement comprises a diode that is forward biased during the negative-going portion to facilitate warming of the junction by the heater arrangement during at least the portion of the lasing state.

18. The apparatus of claim 16, wherein the heater arrangement comprises a temperature sensor configured to measure a temperature of the junction during one or both of the lasing state and the non-lasing state.

19. The apparatus of claim 18, further comprising:
an analyzer configured to determine a temperature at a junction of a laser diode when the laser diode is operated in the lasing state, wherein the analyzer compares the junction temperature and an injection current supplied during the lasing state to stored combinations of junction temperature and injection current to determine a likelihood of mode hopping occurring for the laser diode during the lasing state; and
a controller in communication with the analyzer and configured to vary a current supplied to the heater arrangement for varying a temperature of the junction to reduce the likelihood of mode hopping occurring during the lasing state.

20. The apparatus of claim 16, wherein the heater arrangement is configured to warm the junction to a temperature that falls within a temperature range associated with a reduced risk of mode hopping of the laser diode.

* * * * *